(12) United States Patent
Kim et al.

(10) Patent No.: US 9,236,399 B1
(45) Date of Patent: Jan. 12, 2016

(54) LIQUID CRYSTAL DISPLAY DEVICE AND MANUFACTURING METHOD THEREOF

(71) Applicant: LG Display Co., Ltd., Seoul (KR)

(72) Inventors: Yong-Il Kim, Chungcheongnam-do (KR); Min-Joo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/919,633

(22) Filed: Oct. 21, 2015

Related U.S. Application Data

(62) Division of application No. 14/584,958, filed on Dec. 29, 2014.

(30) Foreign Application Priority Data

Dec. 31, 2013 (KR) .......................... 10-2013-0169083

(51) Int. Cl.
*H01L 27/12* (2006.01)
*H01L 29/66* (2006.01)

(52) U.S. Cl.
CPC ...... *H01L 27/1214* (2013.01); *H01L 29/66742* (2013.01)

(58) Field of Classification Search
None
See application file for complete search history.

(56) References Cited

U.S. PATENT DOCUMENTS

| | | | | |
|---|---|---|---|---|
| 2006/0192906 A1* | 8/2006 | Ryu | ........... | G02F 1/133345 349/43 |
| 2008/0299712 A1* | 12/2008 | Lee | ........... | H01L 21/32134 438/160 |
| 2011/0157039 A1* | 6/2011 | Shin | ........... | G02F 1/13338 345/173 |
| 2012/0146143 A1* | 6/2012 | Kang | ........... | H01L 21/76804 257/347 |
| 2012/0176561 A1* | 7/2012 | Kim | ........... | G02F 1/134363 349/46 |
| 2013/0309821 A1* | 11/2013 | Yoo | ........... | H01L 27/1214 438/158 |
| 2015/0062521 A1* | 3/2015 | Son | ........... | G02F 1/133345 349/138 |
| 2015/0092136 A1* | 4/2015 | Kim | ........... | G02F 1/136227 349/46 |
| 2015/0155310 A1* | 6/2015 | Lee | ........... | H01L 27/1225 257/43 |
| 2015/0162251 A1* | 6/2015 | Jeong | ........... | H01L 27/124 257/48 |
| 2015/0214253 A1* | 7/2015 | Xu | ........... | H01L 27/1248 257/43 |

* cited by examiner

*Primary Examiner* — Alexander Ghyka
(74) *Attorney, Agent, or Firm* — Fenwick & West LLP

(57) ABSTRACT

A liquid crystal display device includes a gate electrode; a gate insulating layer on the gate electrode; an active layer on the gate insulating layer corresponding to the gate electrode; source and drain electrodes on the active layer; a first passivation layer on the source and drain electrodes; a common electrode on the first passivation layer; a second passivation layer on the common electrode, covering the common electrode, and having a separate region from the first passivation layer at a thickness of the common electrode; a pixel electrode on the second passivation layer and connected to the drain electrode through a drain contact hole; and a common line at a same layer as the pixel electrode and connected to the common electrode.

6 Claims, 6 Drawing Sheets ary application under 35 U.S.C.
LIQUID CRYSTAL DISPLAY DEVICE AND MANUFACTURING METHOD THEREOF

CROSS-REFERENCE TO RELATED APPLICATION

This application is a division§121 of U.S. patent application Ser. No. 14/584,958, filed on Dec. 29, 2014, which claims priority from and the benefit under 35 U.S.C. §119(a) to Korean Patent Application No. 10-2013-0169083, filed on Dec. 31, 2013, both of which are hereby incorporated by reference for all purposes as if fully set forth herein.

BACKGROUND OF THE INVENTION

1. Field of the Invention

The present disclosure relates to an advanced horizontal in-plane switching (AH-IPS) type liquid crystal display device (LCD) and a manufacturing method thereof.

2. Discussion of the Related Art

An LCD displays images using a liquid crystal panel and a backlight unit. Conventionally, a twisted nematic (TN) type LCD is used. Alternatively, vertical alignment (VA) type and in-plane switching (IPS) type LCDs are widely used.

Recently, an AH-IPS type LCD is developed. The AH-IPS type LCD provides a better viewing angle and contrast ratio than the IPS type LCD.

Figure (FIG. 1 is a cross-sectional view illustrating an AH-IPS type LCD according to related art.

Referring to FIG. 1, the LCD includes an array substrate including a display region OA and a non-display region NA.

In the array substrate, a thin film transistor Tr, a pixel electrode 52 connected to the thin film transistor Tr, and a common electrode 51 are formed on a substrate 10. In the non-display region NA, a gate line (not shown), a data line 20, a gate pad 25 at an end of the gate line, and a data pad 26 at an end of the data line 20 are formed.

The thin film transistor Tr includes a gate electrode 11, a gate insulating layer 12 on the gate electrode 11, an active layer 23 on the gate insulating layer 12, and source and drain electrodes 22 and 21 on the active layer 23. The thin film transistor Tr has an inverted staggered structure. Alternatively, the thin film transistor Tr may have a coplanar structure.

First and second passivation layers 41 and 42 are formed on the thin film transistor Tr. The second passivation layer 42 functions as a planarization layer. When a planarization is not required, the second passivation layer 42 may be omitted.

A common electrode 51 is formed on the second passivation layer 42. A third passivation layer 43 is formed on the common electrode 51 and covers the common electrode 51. A pixel electrode 52 is formed on the third passivation layer 43.

In this configuration, a fringe field is produced between the common electrode 51 and the pixel electrode 52, thus arrangement of liquid crystal molecules is changed by the fringe field.

In the related art LCD, the array substrate for the LCD is manufactured with as many as 6 or 7 mask processes. For example, the array substrate for the LCD is manufactured with one mask process to form the gate electrode 11, one or two mask processes to form the active layer 23 and the source and drain electrodes 22 and 21, one mask process to pattern the first and second passivation layers 41 and 42, one mask process to form the common electrode 51, one mask process to pattern the third passivation layer 43, and one mask process to form the pixel electrode.

Therefore, manufacturing processes of conventional AH-IPS type LCDs are inefficient and manufacturing costs are increased.

SUMMARY OF THE INVENTION

Accordingly, the present invention is directed to a liquid crystal display device (LCD) that substantially obviates one or more of the problems due to limitations and disadvantages of the related art.

An advantage of the present invention is to provide an LCD that can reduce manufacturing processes and costs.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a liquid crystal display device includes a gate electrode; a gate insulating layer on the gate electrode; an active layer on the gate insulating layer corresponding to the gate electrode; source and drain electrodes on the active layer; a first passivation layer on the source and drain electrodes; a common electrode on the first passivation layer; a second passivation layer on the common electrode, covering the common electrode, and having a separate region from the first passivation layer at a thickness of the common electrode; a pixel electrode on the second passivation layer and connected to the drain electrode through a drain contact hole; and a common line at a same layer as the pixel electrode and connected to the common electrode.

In another aspect, a liquid crystal display device includes a gate electrode; a gate insulating layer on the gate electrode; an active layer on the gate insulating layer corresponding to the gate electrode; source and drain electrodes on the active layer; a first passivation layer on the source and drain electrodes; a second passivation layer on the first passivation layer; a common electrode on the second passivation layer and exposing a portion of the second passivation layer; a third passivation layer on the common electrode and having a separate region from the second passivation layer, wherein the common electrode is not located at the separate region; a pixel electrode on the third passivation layer and connected to the drain electrode through a drain contact hole; and a common line at a same layer as the pixel electrode and connected to the common electrode.

In another aspect, a method of manufacturing a liquid crystal display device includes forming a gate line, a gate electrode and a gate pad on a substrate; forming a gate insulating layer on the gate line, the gate electrode and the gate pad; forming a data line, a source electrode, a drain electrode and a data pad on the gate insulating layer; forming a first passivation layer on the data line, the source electrode, the drain electrode and the data pad; forming a common layer on the first passivation layer; forming a second passivation layer on the common layer; first dry etching the second passivation layer; first wet etching the common layer exposed through the first dry-etched second passivation layer to form a common pattern; second dry etching the gate insulating layer, the first passivation layer and the second passivation layer; second wet etching the common pattern exposed through the second dry-etched second passivation layer to form a common electrode; and forming a pixel electrode and a common line on the second passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments, examples of which are illustrated in the accompanying drawings. The same reference numbers may be used throughout the drawings to refer to the same or like parts.

Figure 1:
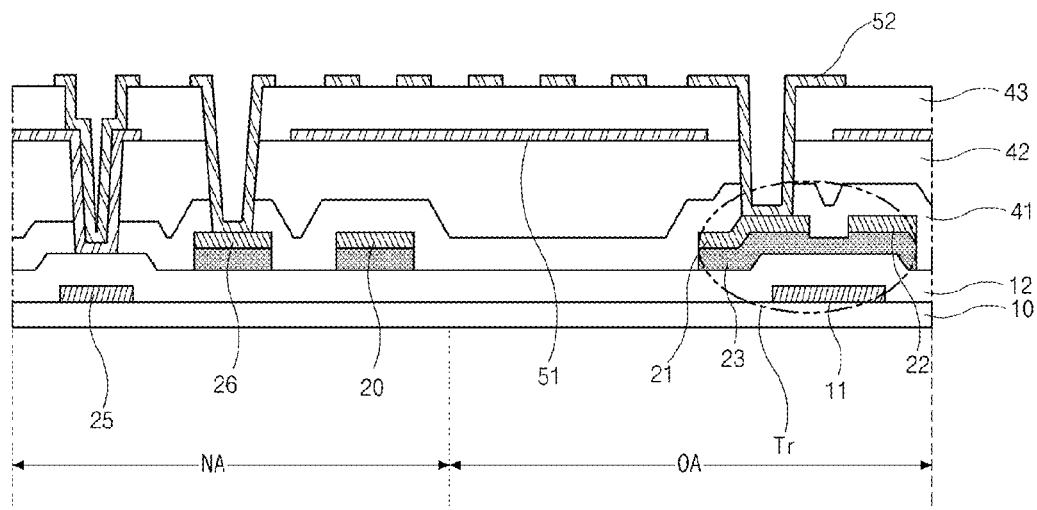
FIG. 1 is a cross-sectional view illustrating an AH-IPS type LCD according to related art.
Figure 2:
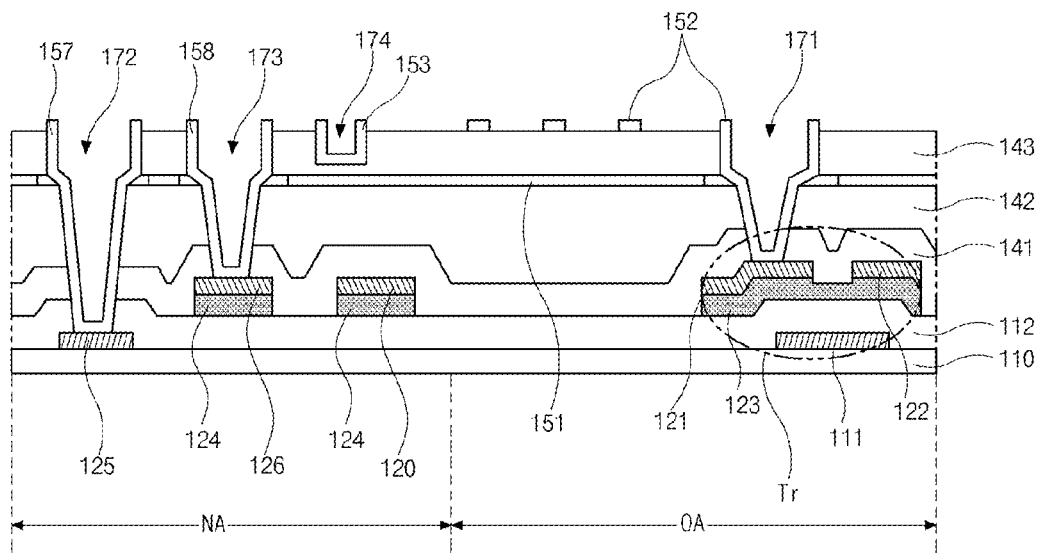
FIG. 2 is a cross-sectional view illustrating an AH-IPS type LCD according to an embodiment of the present invention.

FIG. 2 is a cross-sectional view illustrating an AH-IPS type LCD according to an embodiment of the present invention.

Referring to FIG. 2, the LCD includes an array substrate including a display region OA to display an image and a non-display region NA. The display region OA corresponds to a pixel region.

In the array substrate, a gate electrode 111 is formed in the pixel region on a substrate 110, a gate insulating layer 112 is formed on the gate electrode 111, and an active layer 123 is formed on the gate insulating layer 112. A source electrode 122 and a drain electrode 121 are formed on the active layer 123 and spaced apart from each other. First and second passivation layers 141 and 142 are formed on the source and drain electrodes 122 and 121. A common electrode 151 is formed on the second passivation layer 142, and a third passivation layer 143 is formed on the common electrode 151. A pixel electrode 152 is formed on the third passivation layer 143.

The gate electrode 111, the active layer 123, and the source and drain electrodes 122 and 121 form a thin film transistor Tr. When a gate signal is applied to the gate electrode 111, the thin film transistor Tr is turned on, and a data voltage supplied to the source electrode 122 is applied to the pixel electrode 152 through the thin film transistor Tr.

The gate electrode 111 may extend from a gate line (not shown), and is supplied with a gate signal from a gate driver connected to a liquid crystal panel.

The gate electrode 111 may be preferably made of an opaque material, thus may shield a channel of the active layer 123 from backlight.

The source electrode 122 may extend from a data line 120, and is supplied with a data voltage from a data driver connected to a liquid crystal panel. The drain electrode 121 is connected to the pixel electrode 152.

The source and drain electrodes 122 and 121 may be made of a single-layered structure using a metal material, for example, copper (Cu).

Alternatively, the source and drain electrodes 122 and 121 may have a multiple-layered structure that includes a copper layer and other metal layer below the copper layer. In this regard, the copper layer has a poor adhesive property to the active layer 123, thus the other metal layer having a better adhesive property to the active layer 123 is formed below the copper layer.

The active layer 123 may be made of amorphous silicon. Alternatively, poly silicon or oxide semiconductor may be used for the active layer 123.

The pixel electrode 152 may be made of a transparent conductive material, for example, ITO, IZO, ITZO or IGZO. Alternatively, the pixel electrode 152 may have a multiple-layered structure that uses different conductive materials. For example, the pixel electrode 152 may include a transparent conductive material layer and a metal material layer having a higher conductivity such as copper (Cu).

The pixel electrode 152 may include a plurality of pixel patterns. The pixel electrode 152 may include a plurality of patterns in each pixel region. The pixel patterns may have a bar shape, and an opening may be formed between pixel patterns.

A common line 153 is formed on the third passivation layer 143. The common line 153 may be preferably formed at the same layer and of the same material as the pixel electrode 152.

The common line 153 is connected to the common electrode 151 and functions to transfer a common voltage to the common electrode 151.

The common electrode 151 faces the pixel electrode 152 with the third passivation layer 143 therebetween. The common electrode 151 has substantially a plate shape at the pixel region. The common electrode 151 may be made of a transparent conductive material, for example, ITO, IZO, ITZO or IGZO.

In the non-display region NA, the data line 120, the gate line, a data pad 126 at an end of the data line 120, and a gate pad 125 at an end of the gate line are formed.

A semiconductor pattern 124 formed of the same material as the active layer 123 may be formed below the data line 120 and the data pad 126.

A gate pad terminal 157 may be formed on the third passivation layer 143 and connected to the gate pad 125 through a gate pad contact hole 172. A data pad terminal 158 may be formed on the third passivation layer 143 and connected to the data pad 126 through a data pad contact hole 173. The gate pad terminal 157 and the data pad terminal 158 may be made of the same material as the pixel electrode 152.

FIGS. 3A through 3K are cross-sectional views illustrating a method of manufacturing the LCD according to the embodiment of the present invention.

Figure 3A:
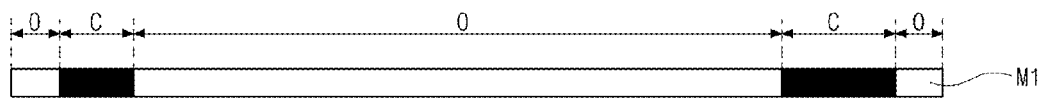
FIGS. 3A through 3K are cross-sectional views illustrating a method of manufacturing the LCD according to the embodiment of the present invention.
Figure 3A:
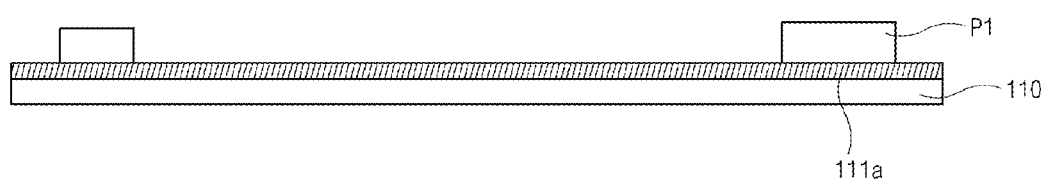

Referring to FIG. 3A, a first metal layer 111a and a first photoresist layer (not shown) are sequentially formed on a substrate 110. A first photo mask M1 including a transmissive portion O and a blocking portion C is located over the substrate 110, and a light exposure is conducted to form a first photoresist pattern P1 corresponding to the blocking portion C.

The first photoresist pattern P1 is formed on regions where a gate electrode, a gate line and a gate pad are formed.

Figure 3B:
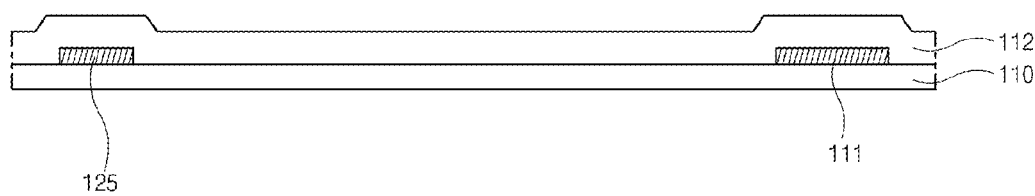

Then, referring to FIG. 3B, the first metal layer 111a is etched using the first photoresist pattern P1 as an etching mask to form the gate electrode 111, the gate line, and the gate pad 125.

Then, the first photoresist pattern is removed. Then, a gate insulating layer 112 is formed on the substrate 110 having the gate electrode 111, the gate line and the gate pad 125.

Figure 3C:
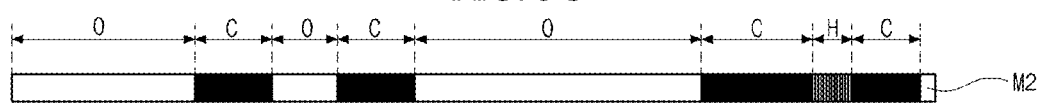
Figure 3C:
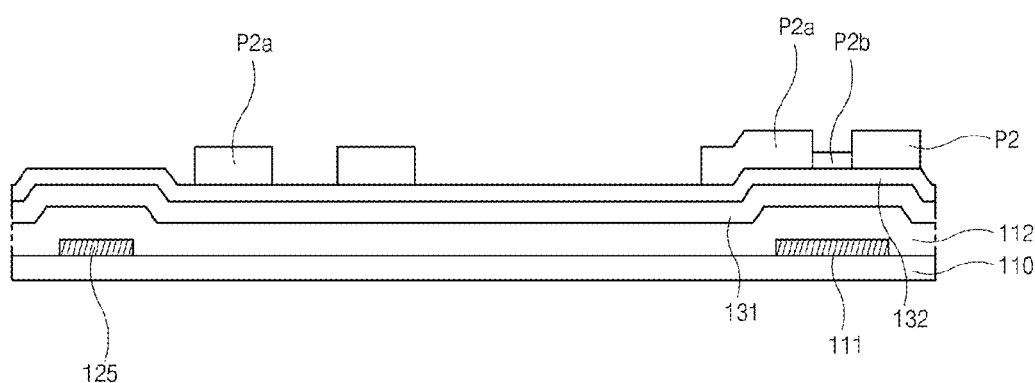

Then, referring to FIG. 3C, a semiconductor layer 131, a second metal layer 132 and a second photoresist layer (not shown) are sequentially formed on the gate insulating layer 112. A second photo mask M2 including a transmissive portion O, a semi-transmissive portion H and a blocking portion C is located over the substrate 110, and a light exposure is conducted to form a second photoresist pattern P2. The second photoresist pattern P2 includes a first pattern P2a corresponding to the blocking portion C, and a second pattern P2b corresponding to the semi-transmissive portion H. The second pattern P2b has a thickness less than a thickness of the first pattern P2a.

The first pattern P2a is formed at regions where a data line, source and drain electrodes and a data pad are formed. The second pattern P2b is formed at a region where a channel of an active layer between the source and drain electrodes is formed.

Figure 3D:
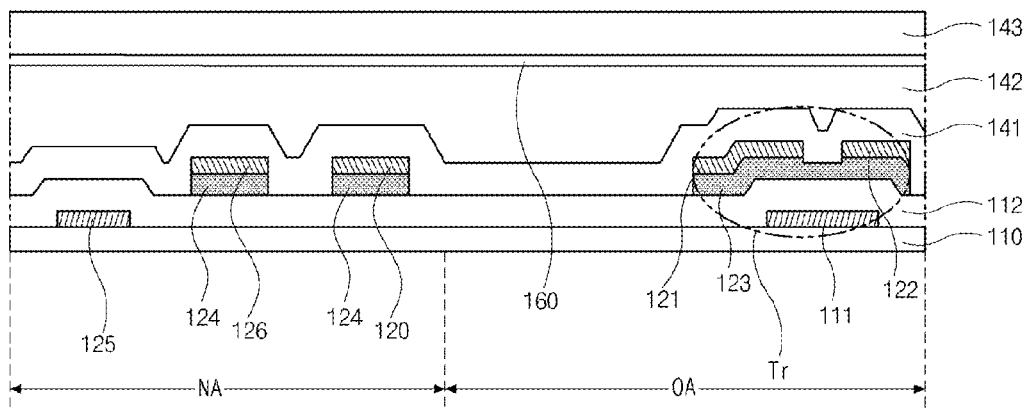

Then, referring to FIG. 3D, the second metal layer 132 and the semiconductor layer 131 are etched using the second photoresist pattern P2 as an etching mask to form a source-drain pattern, the data line 120, the data pad 126, and an active layer 123 below the source-drain pattern. A semiconductor pattern 124 is formed below the data line 120 and the data pad 126.

Then, an ashing process is conducted for the second photoresist pattern P2 to remove the second pattern P2b. The first pattern P2a remains after the ashing process. Then, the source-drain pattern is etched using the ashed second photoresist pattern of the second pattern P2b as an etching mask to form the source and drain electrodes 122 and 121 spaced apart from each other. In this case, a portion of the active layer 123 between the source and drain electrodes 122 and 121 may be partially removed.

Then, the second photoresist pattern P2 of the second pattern P2b is removed.

Then, a first passivation layer 141, a second passivation layer 142, a common metal layer 160, and a third passivation layer 143 are sequentially formed on the substrate 110 having the source and drain electrodes 122 and 121.

The second passivation layer 142 functions as a planarization layer so that a top surface of the second passivation layer 142 is a substantially planar surface. The second passivation layer 142 may be omitted.

The common layer 160 may be formed preferably at a thickness of about between 300 angstroms and 500 angstroms.

Figure 3E:
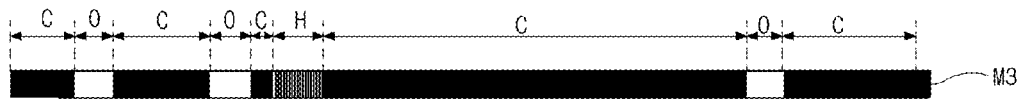
Figure 3E:
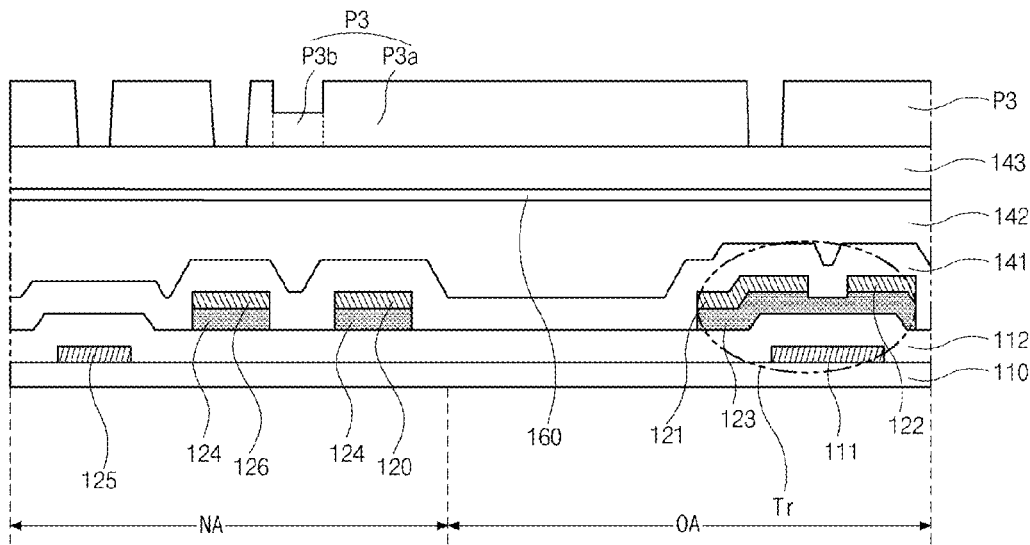

Then, referring to FIG. 3E, a third photoresist layer (not shown) is formed on the third passivation layer 143, and then a light exposure is conducted using a third photo mask M3 including a transmissive portion O, a semi-transmissive portion H and a blocking portion C. Accordingly, a third photoresist pattern P3 is formed.

The third photoresist pattern P3 includes a third pattern P3a corresponding to the blocking portion C, and a fourth pattern P3b corresponding to the semi-transmissive portion H. The fourth pattern P3b has a thickness less than a thickness of the third pattern P3a.

The fourth pattern P3b is formed at a region where a common contact hole is formed. The removed portions of the third photoresist pattern (i.e., openings) are formed at regions where a drain contact hole, a gate pad contact hole, and a data pad contact hole are formed. The third pattern P3a is formed at regions other than the fourth pattern P3b and the removed portion of the third photoresist pattern P3.

Figure 3F:
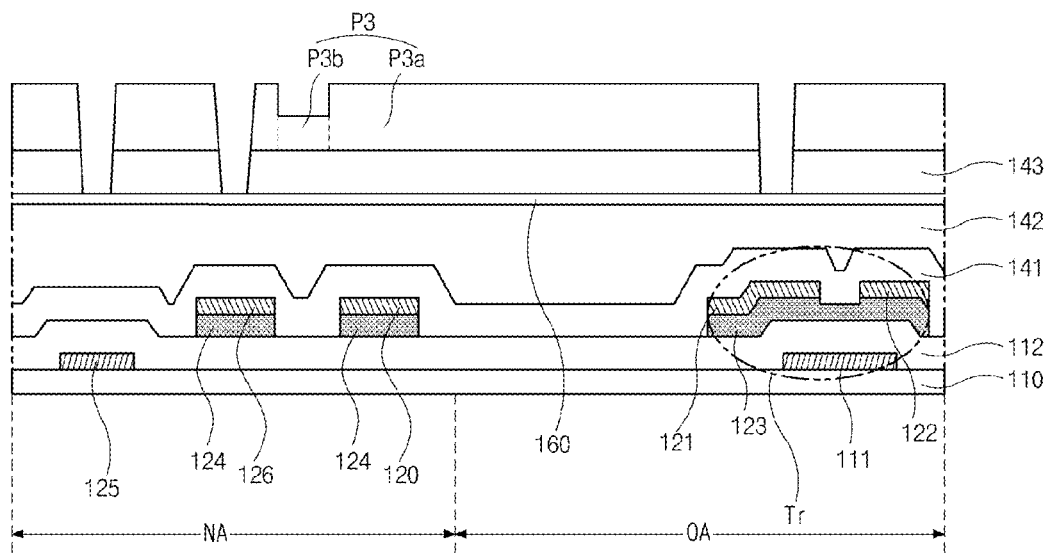

Then, referring to FIG. 3F, the third passivation layer 143 is etched using the third photoresist pattern P3 as an etching mask to form holes in the third passivation layer 143 that expose the common layer 160. This etching may be preferably a dry etching. The dry etching does not influence the common layer 160. The dry etching is an anisotropic etching.

Figure 3G:
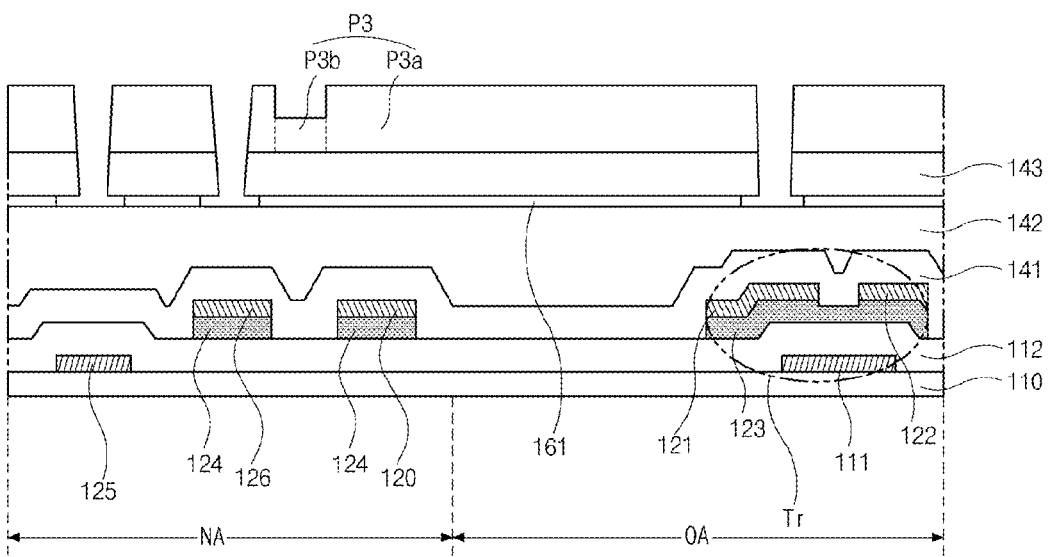

Then, referring to FIG. 3G, the common layer 160 is etched using the third photoresist pattern P3 as an etching mask to form a common pattern 161. This etching may be preferably a wet etching, and the wet etching may preferably use an etching solution including an oxalic acid. The wet etching is an isotropic etching. Since the common layer 160 is wet etched, the common pattern 161 has an under cut shape such that the common pattern 161 has a recessed side surface with respect to a corresponding side surface of the third passivation layer 143.

Figure 3H:
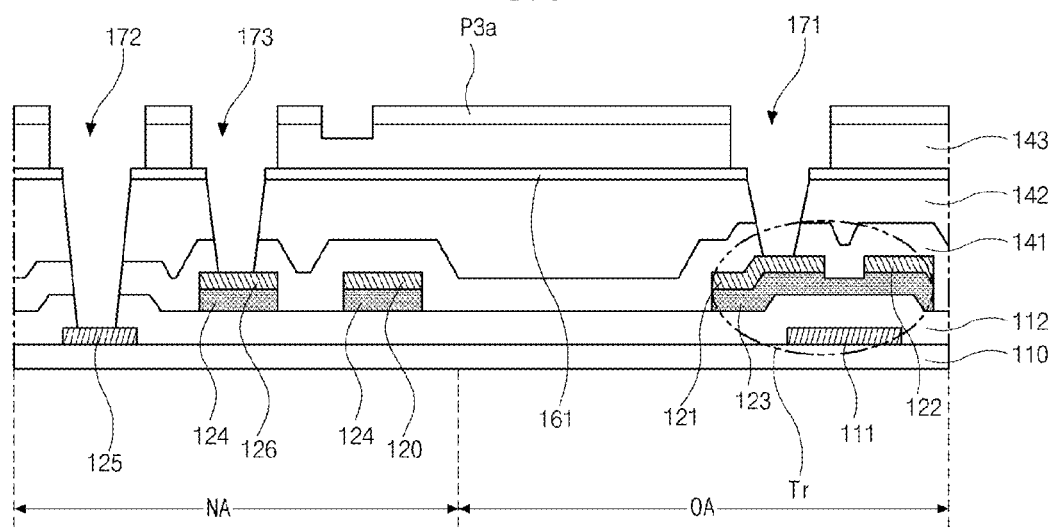

Then, referring to FIG. 3H, the second passivation layer 142, the first passivation layer 141, and the gate insulating layer 112 are etched using the common pattern 161 as an etching mask. This etching may be preferably a dry etching, and the dry etching does not influence the common pattern 161. In this dry etching process, the third passivation layer 143 may be also etched, and the third photoresist pattern may be ashed.

Regarding the above etching processes, an area of the common layer 160 exposed in the dry etching of the third passivation layer 143 is determined by a width of the etched portion (i.e., the opening) of the third passivation layer 143, and a portion of the second passivation layer 142 exposed in the wet etching of the common layer 160 is dry etched. Accordingly, by adjusting the etched area of the common layer 160 (i.e., the area of the common pattern 161), the second passivation layer 142 is etched at a desired width.

Through the etching process in FIG. 3H, and the gate insulating layer 112, the gate pad 125, the data pad 126, and the drain electrode 121 are exposed through holes formed thereover. In other words, a drain contact hole 171 exposing the drain electrode 121, a gate pad contact hole 172 exposing the gate pad 125, and a data pad contact hole 173 exposing the data pad 126 are formed.

Further, the fourth pattern P3b is removed, and a portion of the third passivation layer 143 below the fourth pattern P3b is partially removed. The partially-removed portion of the third passivation layer 143 has a thickness less than a thickness of other portion of the third passivation layer 143.

Further, a side surface of the third passivation layer 143 surrounding each of the contact holes 171, 172 and 173 is recessed with respect to the corresponding side surface of the second passivation layer 142. For example, the side surface of the third passivation layer 143 is recessed by 2 μm or 3 μm with respect to the corresponding side surface of the second passivation layer 142. This is because the etching of the second passivation layer 142 is restricted by the common pattern 161.

Since the second passivation layer 142 and the third passivation layer 143 are etched as described above, a top surface of the common pattern 161 is exposed to outside through the third passivation layer 143. In other words, the common pattern 161 protrudes with respect to the side surface of the third passivation layer 143.

Figure 3I:
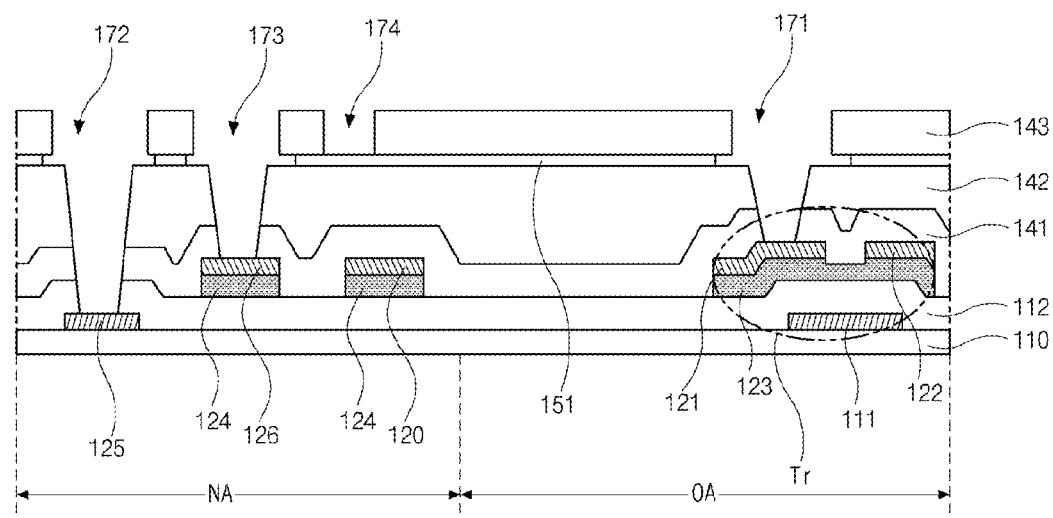

Then, referring to FIG. 3I, the common pattern 161 is wet etched using an etching solution including an oxalic acid to form a common electrode 151. Then, the third passivation layer 143 is dry etched to remove the partially-removed portion of the third passivation layer 143, which corresponds to the fourth pattern P3b, thus a common contact hole 174 exposing the common electrode 151 is formed. Then, the third pattern P3a of the third photoresist pattern P3 is removed.

The wet etching is conducted such that a side surface of the common electrode 151 is recessed with respect to the corresponding side surfaces of the third and second passivation layers 143 and 142. In other words, the common electrode 151 has an under cut shape between the third passivation layer 143 and the second passivation layer 142.

Figure 3J:
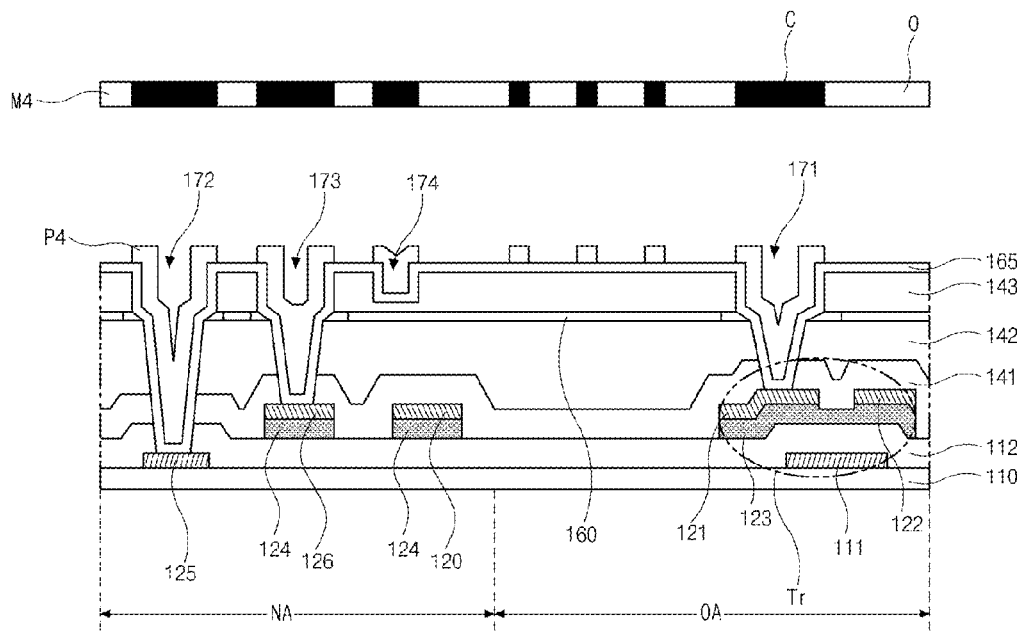

Then, referring to FIG. 3J, a pixel layer 165 and a fourth photoresist layer (not shown) are formed on the substrate 110 having the common electrode 151. A fourth photo mask M4 including a transmissive portion O and a blocking portion C is located over the substrate 110, and a light exposure is conducted to form a fourth photoresist pattern P4.

The pixel layer 165 is formed along the surfaces of the third passivation layer 143 and the second passivation layer 142, and contacts the common electrode 151, the drain electrode 121, the gate pad 125 and the data pad 126.

Since the common electrode 151 has the under cut shape at the drain contact hole 171, the gate pad contact hole 172 and the data pad contact hole 173, the pixel layer 165 does not contact the common electrode 151 at the contact holes 171, 172 and 173 and the pixel layer 165 and the common electrode 151 are separated from each other. In other words, the common electrode 151 and the pixel layer 165 are not short-circuited therebetween at the contact holes 171, 172 and 173.

As described above, the common layer 160 (i.e., common electrode 151) preferably has a thickness between 300 angstroms and 500 angstroms.

In case the common electrode 151 has a thickness over 500 angstroms, the second passivation layer 142 and the third passivation layer 143 are separated over 500 angstroms. In this case, the pixel layer 165 might be disconnected at the separate portion between the second and third passivation layers 142 and 143, thus electrical disconnections of a pixel electrode, a common line, a gate pad terminal and a data pad terminal may occur.

In case the common electrode 151 has a thickness below 300 angstroms, the second passivation layer 142 and the third passivation layer 143 are separated below 300 angstroms. In this case, the pixel layer 165 might not be disconnected at the separate portion between the second and third passivation layers 142 and 143. However, resistance of the common electrode 151 may increase. As a result, power consumption may increase, and electrical disconnection of the common electrode 151 may occur.

Accordingly, it is preferred that the common layer 160 has the thickness of about between 300 angstroms and 500 angstroms.

Figure 3K:
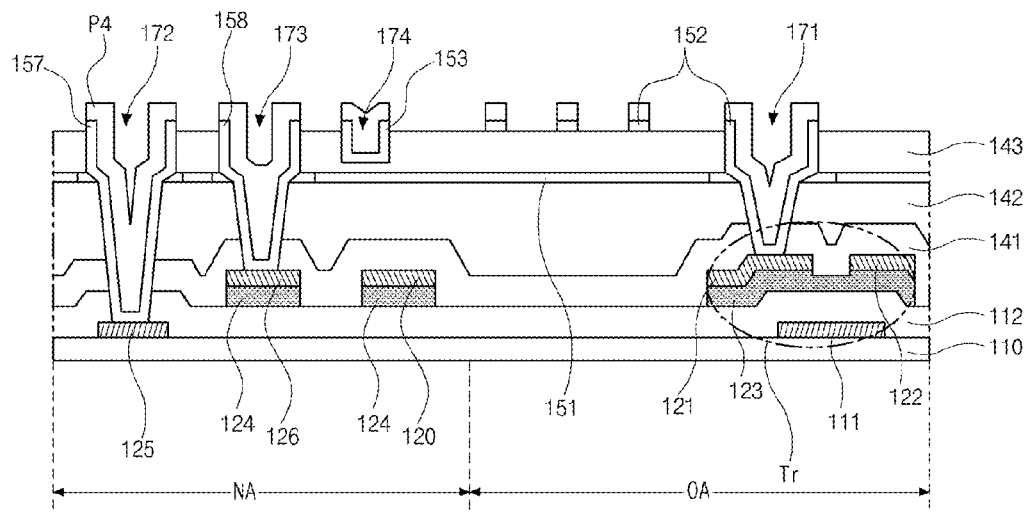

Then, referring to FIG. 3K, the pixel layer 165 is etched using the fourth photoresist pattern P4 as an etching mask. Accordingly, the pixel electrode 152 contacting the drain electrode 121 through the drain contact hole 171, the common line 153 contacting the common electrode 151 through the common contact hole 174, the gate pad terminal 157 contacting the gate pad 125 through the gate pad contact hole 172, and the data pad terminal 158 contacting the data pad 126 through the data pad contact hole 173 are formed. Then, the fourth photoresist pattern P4 is removed.

Through the above processes, the array substrate for the LCD can be manufactured. The array substrate is coupled with an opposing substrate, for example, a color filter substrate with a liquid crystal layer therebetween, thus the LCD can be manufactured.

As described above, the array substrate can be manufactured with four mask processes. Particularly, by forming the common electrode having an under cut shape, the processes after forming the thin film transistor are completed with two mask processes. Therefore, manufacturing processes of AH-IPS type LCD can be performed efficiently and manufacturing costs can be reduced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method of manufacturing a liquid crystal display device, the method comprising:
    forming a gate line, a gate electrode and a gate pad on a substrate;
    forming a gate insulating layer on the gate line, the gate electrode and the gate pad;
    forming a data line, a source electrode, a drain electrode and a data pad on the gate insulating layer;
    forming a first passivation layer on the data line, the source electrode, the drain electrode and the data pad;
    forming a common layer on the first passivation layer;
    forming a second passivation layer on the common layer;
    first dry etching the second passivation layer;
    first wet etching the common layer exposed through the first dry-etched second passivation layer to form a common pattern;
    second dry etching the gate insulating layer, the first passivation layer and the second passivation layer;
    second wet etching the common pattern exposed through the second dry-etched second passivation layer to form a common electrode; and
    forming a pixel electrode and a common line on the second passivation layer.

2. The method of claim 1, wherein the first passivation layer has a planar top surface.

3. The method of claim 1, wherein the first passivation layer has a plurality of passivation layers.

4. The method of claim 1, wherein a side surface of the first passivation layer protrudes by about 2 μm to about 3 μm with respect to a corresponding side surface of the second passivation layer.

5. The method of claim 1, wherein the common electrode has a thickness of about 300 angstroms to about 500 angstroms.

6. The method of claim 1, wherein the data line, the source electrode, the drain electrode and the data pad have a single-layered structure or multiple-layered structure.

* * * * *